(12) United States Patent
Subrahmanyam et al.

(10) Patent No.: US 11,439,037 B2
(45) Date of Patent: Sep. 6, 2022

(54) JET VECTORING FLUID IMPINGEMENT COOLING USING PIVOTING NOZZLES

(71) Applicant: Intel Corporation, Santa Clara, CA (US)

(72) Inventors: Prabhakar Subrahmanyam, San Jose, CA (US); Arun Krishnamoorthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 961 days.

(21) Appl. No.: 15/986,657

(22) Filed: May 22, 2018

(65) Prior Publication Data

US 2019/0364691 A1 Nov. 28, 2019

(51) Int. Cl.
*H05K 7/20* (2006.01)
*H05K 1/02* (2006.01)

(52) U.S. Cl.
CPC ....... *H05K 7/20145* (2013.01); *H05K 1/0203* (2013.01); *H05K 7/20209* (2013.01); *H05K 7/20518* (2013.01)

(58) Field of Classification Search
None
See application file for complete search history.

(56) References Cited

U.S. PATENT DOCUMENTS

| | | | |
|---|---|---|---|
| 5,854,092 A * | 12/1998 | Root | H01L 23/4735 438/106 |
| 7,159,414 B2 | 1/2007 | Tilton et al. | |
| 7,751,188 B1 * | 7/2010 | French | H05K 7/20736 361/691 |
| 7,885,074 B2 | 2/2011 | Campbell et al. | |
| 8,724,322 B2 * | 5/2014 | Rinke | H05K 7/20772 361/699 |
| 9,252,069 B2 * | 2/2016 | Bhunia | H01L 23/3735 |
| 9,347,987 B2 | 5/2016 | Schroeder et al. | |
| 9,653,378 B2 * | 5/2017 | Hou | H01L 23/473 |
| 9,903,664 B2 | 2/2018 | Joshi et al. | |
| 2005/0105012 A1 * | 5/2005 | Kim | G02F 1/133308 349/58 |
| 2007/0074525 A1 * | 4/2007 | Vinson | H05K 7/20745 62/259.2 |
| 2007/0183125 A1 * | 8/2007 | Tilton | H05K 7/20345 361/699 |
| 2009/0084931 A1 | 4/2009 | Sauciuc et al. | |
| 2010/0155047 A1 * | 6/2010 | Lin | H01L 23/467 165/288 |

(Continued)

*Primary Examiner* — Courtney L Smith
(74) *Attorney, Agent, or Firm* — Akona IP

(57) ABSTRACT

Disclosed herein are integrated circuit (IC) packages with a heat generating electronic component and a fluid impingement cooling apparatus having a plurality of rotatable nozzles, as well as related devices and methods. In some embodiments, an IC device assembly may include a plurality of rotatable nozzles disposed in a nozzle plate, wherein the plurality of rotatable nozzles are rotatable individually; a microcontroller to identify a hotspot on a target surface of an IC device, wherein the hotspot has a temperature that is greater than a threshold temperature; and a motor coupled to the plurality of rotatable nozzles, wherein the motor causes one or more of the rotatable nozzles to rotate to impinge fluid on the hotspot.

5 Claims, 11 Drawing Sheets

(56) References Cited

U.S. PATENT DOCUMENTS

| | | | |
|---|---|---|---|
| 2012/0063091 A1* | 3/2012 | Dede | H05K 7/20927 |
| | | | 361/699 |
| 2012/0243169 A1* | 9/2012 | Rinke | H05K 7/20772 |
| | | | 361/679.33 |
| 2017/0196120 A1 | 7/2017 | Oprins et al. | |
| 2018/0199450 A1* | 7/2018 | Kim | H05K 7/20445 |
| 2018/0235106 A1* | 8/2018 | Curtis | H05K 7/20145 |
| 2019/0182986 A1* | 6/2019 | Totani | H05K 7/20736 |

* cited by examiner

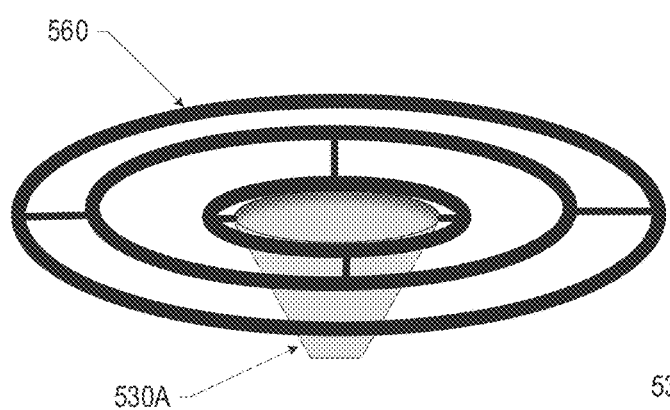
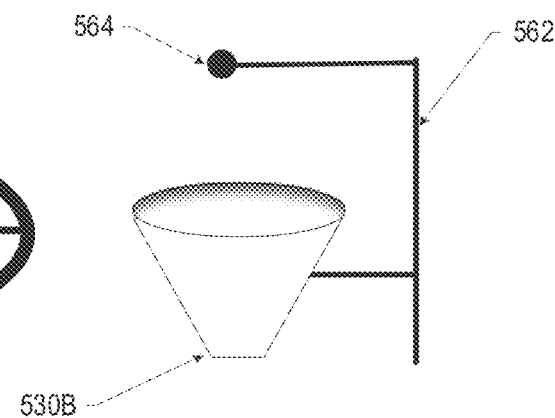
FIG. 5A
FIG. 5B
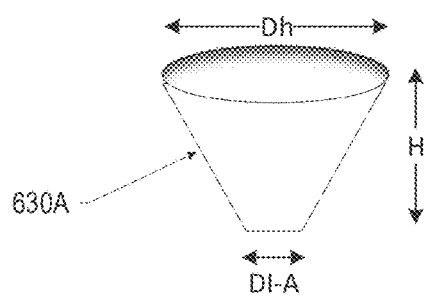
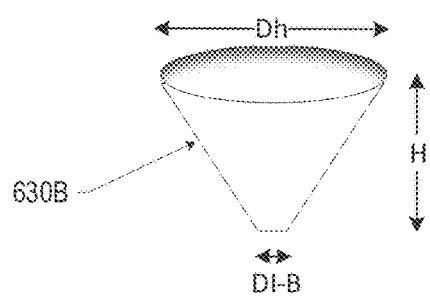
FIG. 6A
FIG. 6B

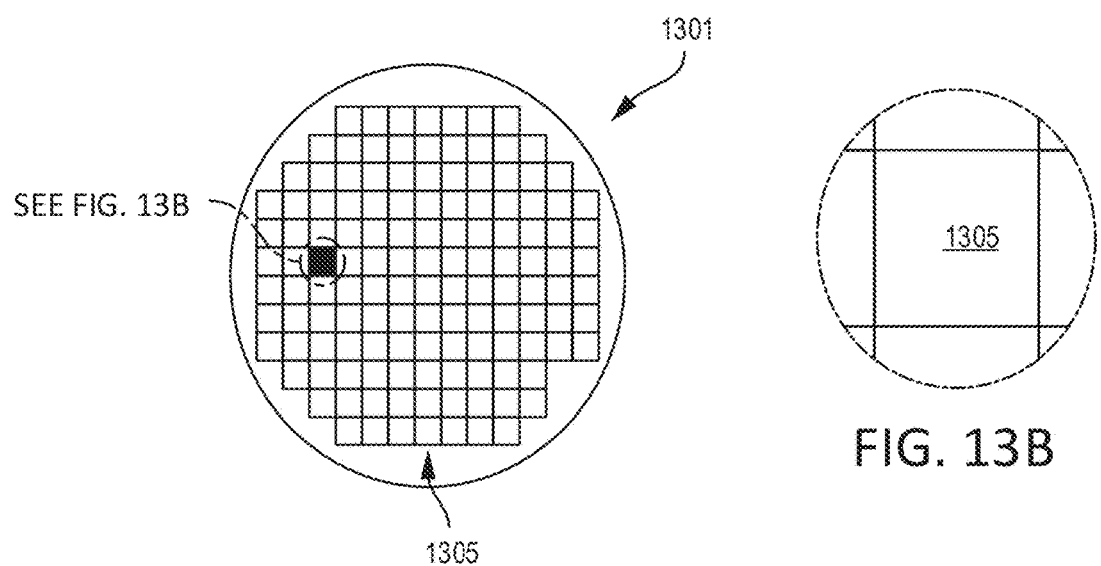
FIG. 13A
FIG. 13B
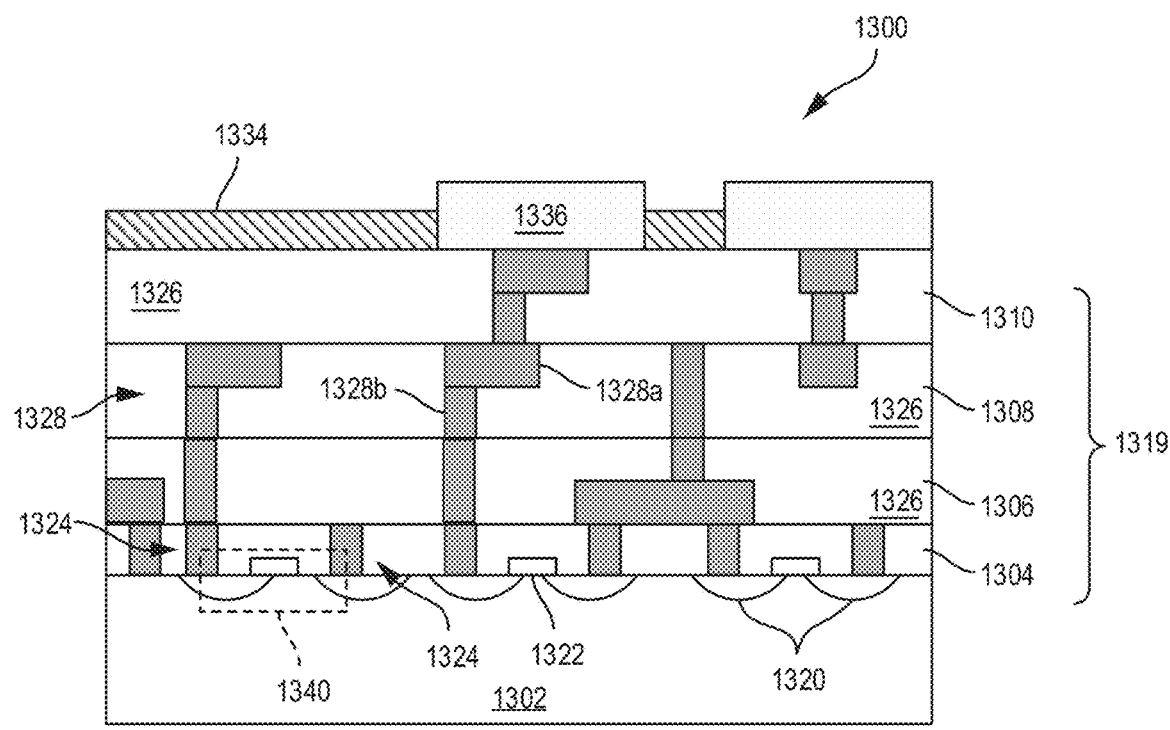
FIG. 13C

JET VECTORING FLUID IMPINGEMENT COOLING USING PIVOTING NOZZLES

BACKGROUND

Electronic components, such as microprocessors and integrated circuits, generally produce heat. Excessive heat may degrade performance, reliability, life expectancy of an electronic component and may even cause component failure. Fluid impingement cooling apparatuses, commonly referred to as jet impingement apparatuses, and other direct liquid contact thermal solutions, are commonly used for dissipating heat and reducing the operational temperature of electronic components in integrated circuit (IC) devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 5A and 5B are schematic illustrations of exemplary structures for rotating a nozzle of a fluid impingement cooling assembly, in accordance with various embodiments.

FIGS. 6A and 6B are schematic illustrations of exemplary conical nozzle designs, in accordance with various embodiments.

FIGS. 13A and 13B are top views of a wafer and dies that may be used with any of the embodiments of the IC packages disclosed herein.

FIG. 13C is a cross-sectional side view of an IC device that may be used with any of the embodiments of the IC packages disclosed herein.

DETAILED DESCRIPTION

Figure 1A:
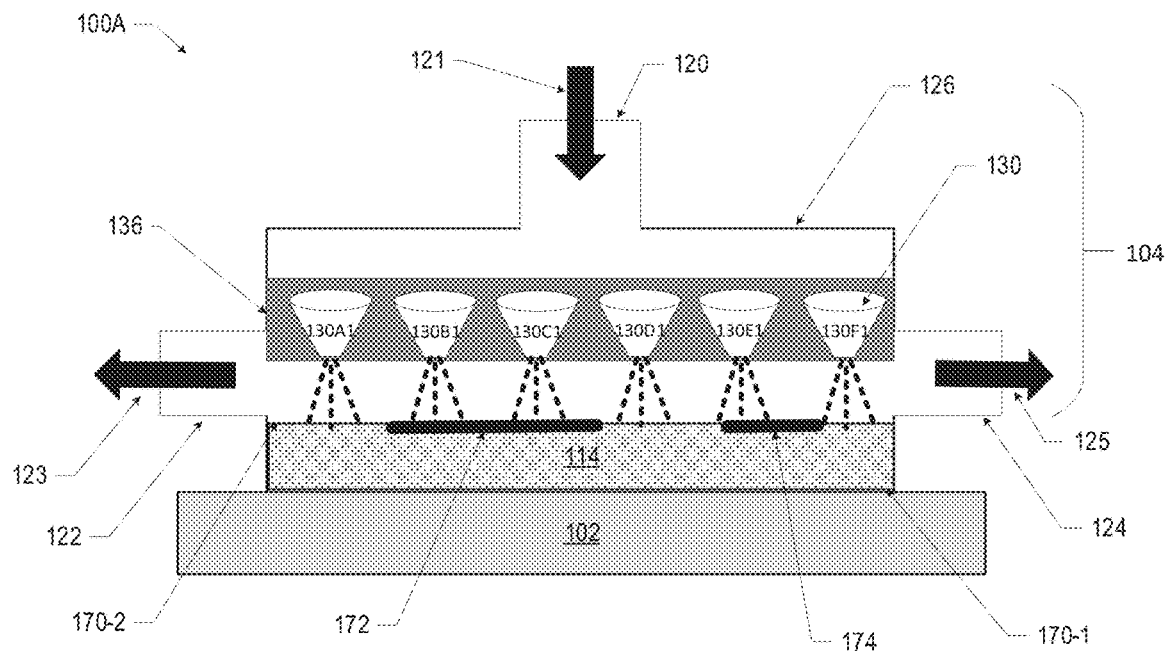
FIGS. 1A and 1B are cross-sectional side views of a microelectronic assembly including an exemplary fluid impingement cooling apparatus on a surface of a heat generating electronic component, in accordance with various embodiments.

Disclosed herein are integrated circuit (IC) packages including a fluid impingement cooling apparatus with a rotatable nozzle to cool an electronic component that generates non-uniform heat on a surface, as well as related devices and methods. For example, in some embodiments, an IC device assembly may include a plurality of rotatable nozzles disposed in a nozzle plate, wherein the plurality of rotatable nozzles are rotatable individually; a microcontroller to identify a hotspot on a target surface of an IC device, wherein the hotspot has a temperature that is greater than a threshold temperature; and a motor coupled to the plurality of rotatable nozzles, wherein the motor causes one or more of the rotatable nozzles to rotate to impinge fluid on the hotspot. In some embodiments, a method of cooling an integrated circuit (IC) device, including: identifying, by control circuitry, a temperature of an area on a surface of an IC device, wherein the IC device includes an IC die; determining, by the control circuitry, that the temperature is at or above a threshold temperature; and causing, by the control circuitry, one or more nozzles of a cooling apparatus to rotate to impinge fluid on the area.

In some embodiments, a computing device, including: an integrated circuit (IC) package including: a package substrate having a first face and an opposing second face; an electronic component having a first face and an opposing second face, wherein the first face of the electronic component is electrically coupled to the first face of the package substrate, and wherein the second face of the electronic component has a first target area and a second target area different from the first target area; and a cooling apparatus proximate to the second face of the electronic component, including: a fluid inlet; a fluid outlet; and a plurality of rotatable nozzles disposed in a nozzle plate to impinge fluid on the second face of the electronic component, wherein an individual rotatable nozzle of the plurality of rotatable nozzles in a first orientation impinges fluid on the first target area and when rotated to a second orientation impinges fluid on the second target area.

IC devices may include a heat generating electronic component, such as a microprocessor die, which may affect the reliability of the IC device. For example, the performance of an electronic component may decrease as a result of its heat generating nature. An electronic component may generate heat non-uniformly such that a surface of the electronic component may have localized high heat flux zones, commonly referred to as hotspots. An electronic component may create varying amounts of heat on a surface and a varying amount of heat as a function of time. Some IC devices may include a thermal solution, such as a liquid cooling apparatus, in order to transport heat generated by an electronic component during operation away from a surface of the electronic component. Conventional liquid cooling apparatuses may include an array of nozzles to directly impinge fluid uniformly on a surface. A cooling apparatus that includes rotatable nozzles for the localized cooling of hotspots may be desirable.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The terms "electrical component," "electronic component," and "electronic device" may be used interchangeably. As used herein, the terms "rotate," "pivot," "incline," "swivel," angle," "turn," and "tilt," in all grammatical forms, may be used interchangeable and may refer to movement about an axis or more than one axes.

The accompanying drawings are not necessarily drawn to scale. For ease of discussion, the singular term of a Figure may be used to refer to the collection of drawings of that referenced Figure. For example, the term "FIG. 1" may be used to refer to the collection of drawings of FIGS. 1A-1B, and the term "FIG. 2" may be used to refer to the collection of drawings of FIGS. 2A-2C.

In the following detailed description, reference is made to the accompanying drawings that form a part hereof, wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Figure 1B:
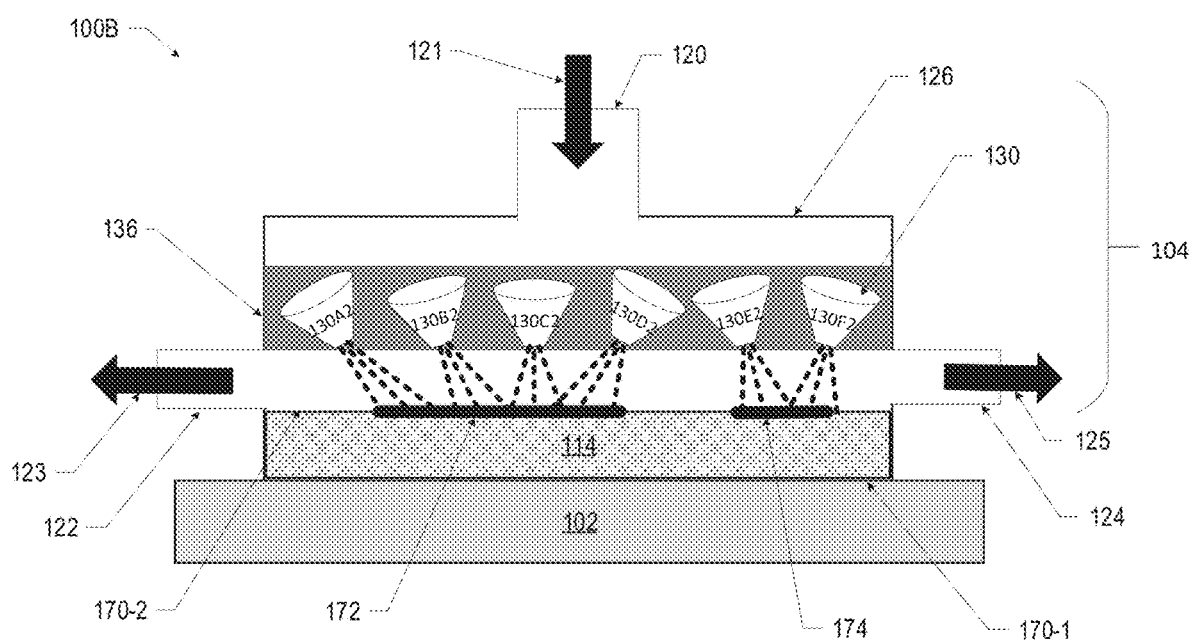

FIGS. 1A and 1B are cross-sectional side views of a microelectronic assembly including an exemplary cooling apparatus having rotatable nozzles to impinge fluid on a surface of a heat generating electronic component, in accordance with various embodiments. As shown in FIGS. 1A and 1B, the microelectronic assembly 100 may include a die 114, a package substrate 102 and a fluid impingement cooling assembly 104. The die 114 may include a first surface 170-1 and an opposing second surface 170-2. The die 114 may be coupled to the package substrate 102 on the first surface 170-1. The cooling assembly 104 may be on the second surface 170-2 of the die 114. The cooling assembly 104 may include a housing 126, a fluid inlet 120, one or more fluid outlets 122, 124, and a plurality of rotatable nozzles 130 to impinge fluid on the second surface 170-2 of the die 114. The plurality of rotatable nozzles 130 may include a housing 136 and/or a plate (not shown) having a plurality of orifices for housing or seating the nozzles. FIG. 1A shows the rotatable nozzles 130 in a first orientation and FIG. 1B shows the rotatable nozzles 130 in a second orientation. The second surface 170-2 of die 114 may include one or more hotspots 172, 174, or areas having a temperature above a threshold temperature, during operation. A threshold temperature defining a hotspot may differ for different electronic components and systems. A hot spot may be an area on the face of an electronic component where the temperature during operation of the electronic component exceeds a threshold temperature. A hot spot generally describes an unwanted localization of heat on an electronic component and is typically associated with structures that generate high power or heat, such as processor cores. Some electronic components generate high heat (e.g., run hot) such that heat is not localized rather the hot spot covers the entire surface of the electronic component. In some embodiments, a power map or heat map of an electronic component may be determined from numerical modeling prior to building the electronic component. The heat map values for an electronic component may be confirmed empirically using thermal measurement techniques known in the art. A threshold temperature may depend on the maximum temperature during operation, the sensitivity of an electronic component or system to temperature, the sensitivity of an electronic component or system to temperature variance, and the duration, among others. In some embodiments, a threshold temperature defining a hotspot may be greater than 40 degrees Celsius. In some embodiments, a threshold temperature defining a hotspot may be greater than 60 degrees Celsius. In some embodiments, a threshold temperature may be 80 degrees Celsius or greater, for example, a temperature range of 80 degrees Celsius to 120 degrees Celsius.

During operation of the cooling assembly 104, fluid may enter 121 via the fluid inlet 120, may flow through the plurality of rotatable nozzles 130 to impinge fluid on the second surface 170-2 of the die 114, and may exit 123, 125 via the one or more fluid outlets 122, 124. In some embodiments, as shown in FIG. 1A, the plurality of rotatable nozzles 130 may have a first orientation 130A1-130F1 to impinge fluid on a first area on the second surface 170-2 of the die 114, where the first area is directly below the individual nozzles. For example, in this first orientation, individual nozzles 130B1 and 130C1 impinge on hotspot 172, which is directly below these nozzles, and individual nozzle 130E1 impinges on hotspot 174, which is directly below the individual nozzle 130E1. In some embodiments, as shown in FIG. 1B, the plurality of rotatable nozzles 130 may have a second orientation 130A2-130F2 to impinge fluid on a second area on the second surface 170-2 of the die 114, where the second area is a hotspot. For example, in this second orientation, individual nozzles 130A2-130D2 impinge on hotspot 172 and individual nozzles 130E2-130F2 impinge on hotspot 174.

Although FIG. 1 depicts a single die 114, the microelectronic assembly 100 may have any suitable number of dies. In some embodiments, the die 114 may be an active or passive die that may include input/output circuitry, high bandwidth memory, or enhanced dynamic random access memory (EDRAM). For example, die 114 may include a processor (e.g., including transistors, arithmetic logic units, and other components) that may include a central processing unit (CPU), a graphics processing unit (GPU), or both. In some embodiments, microelectronic assemblies disclosed herein may include a plurality of dies coupled to the package substrate 102 or coupled to another die in a package-on-package (PoP) configuration. In some embodiments, the microelectronic assembly 100 may serve as a system-in-package (SiP) in which multiple dies having different functionality are included. In such embodiments, the microelectronic assembly may be referred to as an SiP.

Figure 2A:
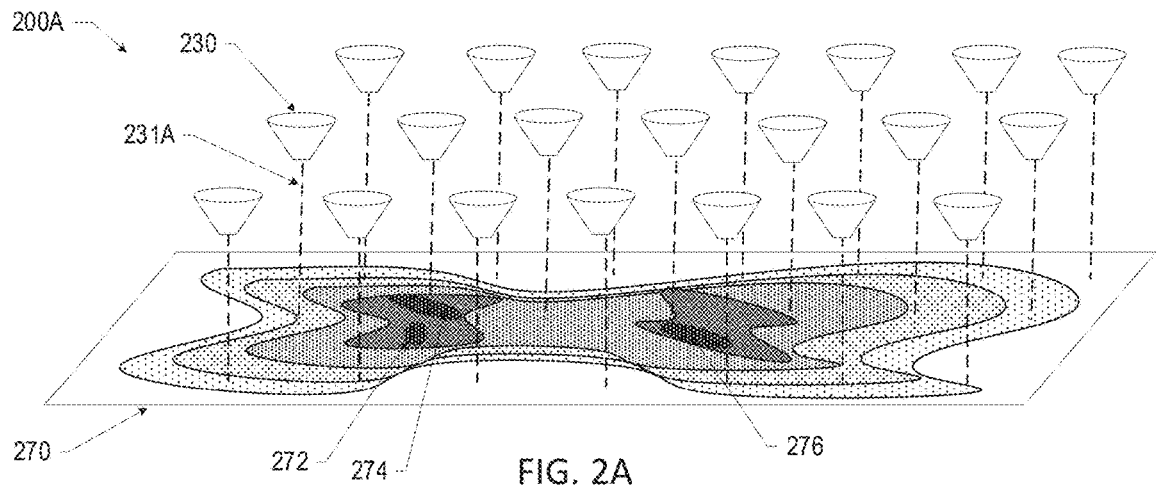
FIGS. 2A-2C are perspective views illustrating an exemplary cooling assembly impinging fluid on a surface of a heat generating electronic component, in accordance with various embodiments.
Figure 2B:
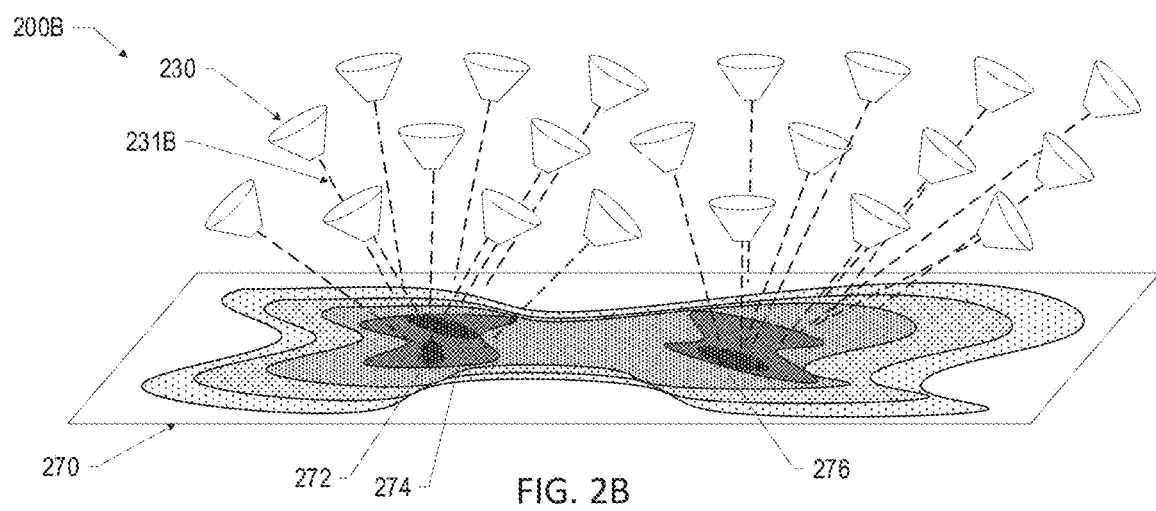
Figure 2C:
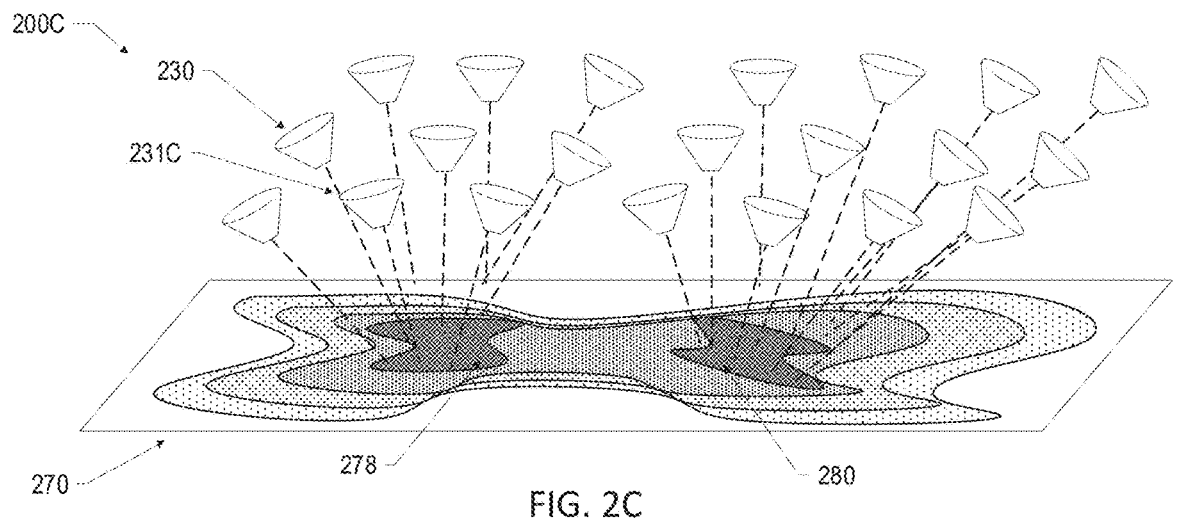

FIGS. 2A-2C are schematic perspective views illustrating an exemplary cooling assembly, in accordance with various embodiments. As shown in FIGS. 2A-2C, a cooling apparatus 200 may include a plurality of rotatable nozzles 230 to impinge fluid 231 on a surface 270 of a heat generating electronic component (not shown). The surface 270 of the heat generating electronic component may include one or more hotspots 272, 274, 276, 278, 280 as indicated by the shaded areas. As depicted in FIGS. 2A-2C, the darker the shading of the area, the higher the temperature. As shown in FIG. 2A, an individual nozzle of the array of rotatable nozzles 230 may have a first orientation 231A to impinge fluid on a surface 270 in the area directly below the individual nozzle. In this first orientation 231A, the array of rotatable nozzles 230 may impinge fluid such that a large area of the surface 270 is contacted by the fluid. As shown in FIG. 2B, an individual nozzle of the array of rotatable nozzles 230 may have a second orientation 231B to impinge fluid on a hotspot 272, 274, 276 such that fluid is concentrated to cool the hotspots. As shown in FIG. 2C, once hotspots 272, 274, 276 are cooled, an individual nozzle of the array of rotatable nozzles 230 may have a third orientation 231C to impinge fluid on a hotspot 278, 280, where a temperature of hotspots 272, 274, 276 is higher than a temperature of hotspots 278, 280, so that the rotatable nozzles may more effectively cool a surface by chasing or cooling the hottest areas first, then moving to cool the next hottest areas, and repeating this process.

In some embodiments, a cooling apparatus having rotatable nozzles may impinge fluid on a surface of an electronic component while the electronic component is operating even if one or more hotspots are not created. For example, a cooling apparatus having rotatable nozzles may impinge fluid on a surface in a first orientation where each individual nozzle impinges fluid on an area directly below the individual nozzle, then, if one or more hotspots are created, the rotatable nozzles may be rotated to a second orientation to impinge fluid on the one or more hotspots. Each individual nozzle may have a different first and second orientation. In some embodiments, the rotatable nozzles may be rotated to a third orientation to impinge fluid on another hotspot. The rotatable nozzles may continue to be rotated to impinge fluid on one or more hotspots until the entire surface of the electronic component is cooled (e.g., the surface is at or below a designated temperature) or does not have hotspots (e.g., the surface does not have areas above a threshold temperature). In some embodiments, the rotatable nozzles may be rotated back to the first orientation until another hotspot is created. In some embodiments, a cooling apparatus having rotatable nozzles may impinge fluid on a surface of an electronic component only when one or more hotspots are created. For example, rotatable nozzles of a cooling apparatus may be rotated to a first orientation to impinge fluid on a first hotspot, and once a first hotspot has been cooled, the rotatable nozzles may be rotated to a second orientation to impinge fluid on a second hotspot. In some embodiments, a temperature of a first hotspot is greater than a temperature of a second hotspot. In some embodiments, an area of a first hotspot is greater than an area of a second hotspot. In some embodiments, the rotatable nozzles may be rotated to a third orientation to impinge fluid on a third hotspot, where a temperature or an area of the third hotspot is less than a temperature or an area of the second hotspot. This process may be repeated until the surface of the electronic component has been cooled, and/or the surface no longer has a hotspot.

Figure 3:
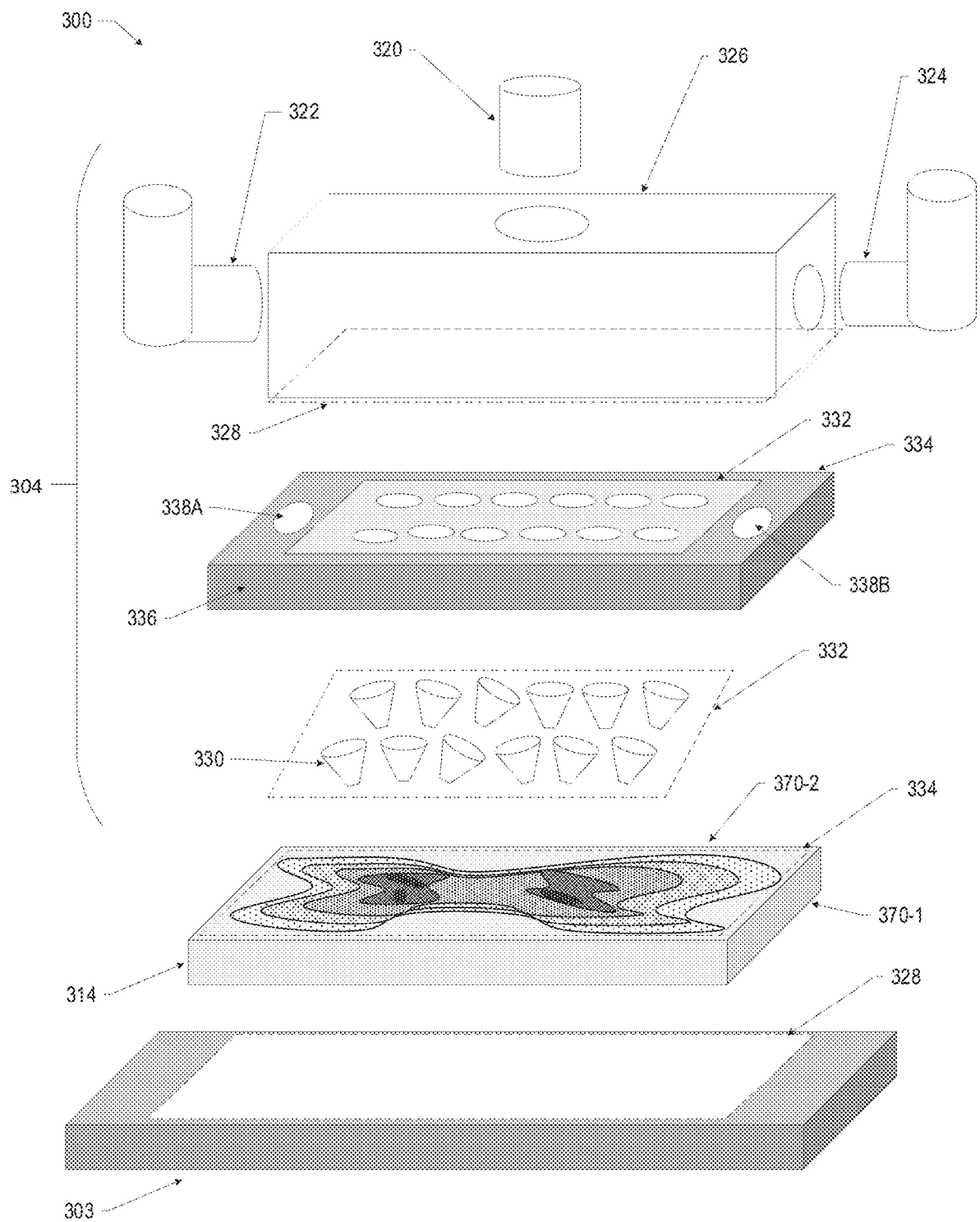
FIG. 3 is a perspective exploded view of a microelectronic assembly including an exemplary fluid impingement cooling assembly, in accordance with various embodiments.

FIG. 3 is a perspective exploded view of a microelectronic assembly including an exemplary fluid impingement cooling assembly, in accordance with various embodiments. As shown in FIG. 3, a microelectronic assembly 300 may include a heat generating electronic component 314, a circuit board 303, and a cooling assembly 304 having a plurality of rotatable nozzles 330. The electronic component 314 may include a first surface 370-1 and an opposing second surface 370-2. The circuit board 303 may be coupled to the first surface 370-1 of the electronic component 314 and the cooling assembly 304 may be on the second surface 370-2 of the electronic component 314. In some embodiments, the circuit board 303 may include a mother board or a printed circuit board (PCB). In some embodiments, the circuit board 303 may be something other than a circuit board such as a package substrate as depicted in FIG. 1. The electronic component 314 may be electrically coupled to the circuit board 303 using any suitable interconnect, including ball grid array, pin grid array, land grid array, or wirebond. In some embodiments, the surface 370-2 of the electronic component 314 may include thermal sensors (not shown) for measuring and/or recording temperature data of the surface 370-2. The thermal sensors may be on, below, proximate to, or adjacent to the target surface. The temperature data may be provided to a microcontroller for identifying the location of hotspots on the surface 370-2 and directing or rotating one or more rotatable nozzles 330 to impinge on the hotspots. The cooling assembly 304 may include a housing 326 for containing a fluid and a nozzle plate 336 having a plurality of orifices for seating a plurality of rotatable nozzles 330. The housing 326 may include a fluid inlet 320, a first fluid outlet 322, and a second fluid outlet 324. The housing 326 may have an outer dimension 328 (e.g., outer perimeter) such that the housing 326 may set on the circuit board 303. In some embodiments, the nozzle plate 336 at the outer dimension 334 may set on the electronic component 314. The housing 326 may be secured and/or sealed to the circuit board 303 or electronic component 314 using any suitable means, such as adhesive, a gasket, or an O-ring. The housing 326 may be made of any suitable material, such as a polymer, such as polycarbonate, or a metal, such as brass, copper, or aluminum, and may be transparent or opaque. Although FIG. 3 depicts the housing 326 as cuboidal, the housing may have any suitable size and shape. The housing 326 may provide a closed system to flow cool fluid from the fluid inlet 320 through the plurality of rotatable nozzles 330 to the surface 370-2 of the electronic component 314 and out the fluid outlets 322, 324. The closed system may further include pipes or connections to a heat exchanger, a chiller, or other device for cooling the fluid (not shown) before returning the fluid to the fluid inlet. The fluid may be circulated through the system using a pump, which may be a separate piece of equipment or may be part of a cooling device. Although FIG. 3 depicts two fluid outlets, any number of fluid outlets may be used, including one, three or more than three. Depending on the design of the cooling assembly, the fluid outlets 322, 324 may be positioned above or below the plurality of rotatable nozzles 330 for fluid to flow out of the cooling assembly 304. For example, in some embodiments, nozzle plate 336 may include one or more openings 338A, 338B for fluid to flow from the surface 370-2 of the electronic component to the fluid outlets 322, 324 above the nozzle plate 336. In some embodiments, the fluid outlets 322, 324 may be below the nozzle plate 336 and fluid may flow horizontally from the surface 370-2 of the electronic component 314 to the fluid outlets 322, 324.

The nozzle plate 336 may include a frame having an inner dimension 332 (e.g., inner perimeter) and an outer dimension 334 (e.g., outer perimeter). In some embodiments, the nozzle plate 336 at the outer dimension 334 may set on the electronic component 314 (e.g., so that the nozzle plate may be above or adjacent to the target surface of the electronic component). In some embodiments, the nozzle plate 336 at the outer dimension 334 may set on the circuit board 303. The nozzle plate 336 may be secured and/or sealed to the electronic component 314 or circuit board 303 using any suitable means, such as adhesive, a gasket, or an O-ring. In some embodiments, the nozzle plate 336 may be movable in the z-direction. For example, the nozzle plate 336 may be mounted on a piston (not shown) so that the plurality of nozzles may be moved closer to or farther away from the surface 370-2. The nozzle plate 336 may be made of any suitable material, including a ceramic or a metal, such as copper, brass, or aluminum. A plurality of rotatable nozzles 330 may be arranged within the inner dimension 332. In some embodiments, the plurality of rotatable nozzles 330 may be positioned or embedded in orifices in the nozzle plate. Although FIG. 3 depicts an orifice plate having twelve nozzles arranged in two rows on a single electronic component, any suitable number of rotatable nozzles and any suitable arrangement may be used. The number of rotatable nozzles and arrangement may be scaled and may depend on the number of electronic components being cooled, the size of the surface being cool, and the number of the maximum temperature of the surface, among others. In some embodiments, a cooling assembly may have an even number of rotatable nozzles. In some embodiments, a cooling assembly may have an odd number of rotatable nozzles. In some embodiments, the plurality of rotating nozzles may be evenly or uniformly distributed over a heat generating surface, for example, arranged in a grid of columns and rows. In some embodiments, the plurality of rotating nozzles may be unevenly or non-uniformly distributed over a heat generating surface, for example, arranged in clusters or groups. For example, twenty rotating nozzles may be evenly distributed over an entire heat generating surface. In another example, fifteen rotating nozzles may be arranged in groups of four or five and may be distributed over only a portion of the heat generating surface. In some embodiments, a cooling assembly may cold more than one electronic component. For example, a cooling assembly may be on a package substrate having more than one heat generating electronic components. In some embodiments, the nozzle plate 336 may further include a microcontroller (not shown) for analyzing temperature data, identifying a hotspot, and assigning rotatable nozzles to impinge fluid on the hotspot, as described in detail with reference to FIG. 9.

In some embodiments, the nozzle plate 336 may further include a motor (not shown), such as an electric motor, or a servomotor. A motor may be connected to a nozzle to rotate the nozzle. In some embodiments, a motor may be connected to a strut or an actuator, which is connected to a nozzle, where the strut or actuator receives a signal from the motor to rotate one or more nozzles. In some embodiments, an individual nozzle may be rotated individually. In some embodiments, one or more nozzles may be connected and may be rotated together. In some embodiments, each individual nozzle may be uniquely identified and rotated separately. In some embodiments, a plurality of nozzles may be uniquely identified and rotated as a group. The components of the microelectronic assembly (e.g., the microprocessor and the motor) may be coupled and may communicate via control circuitry.

Figure 4:
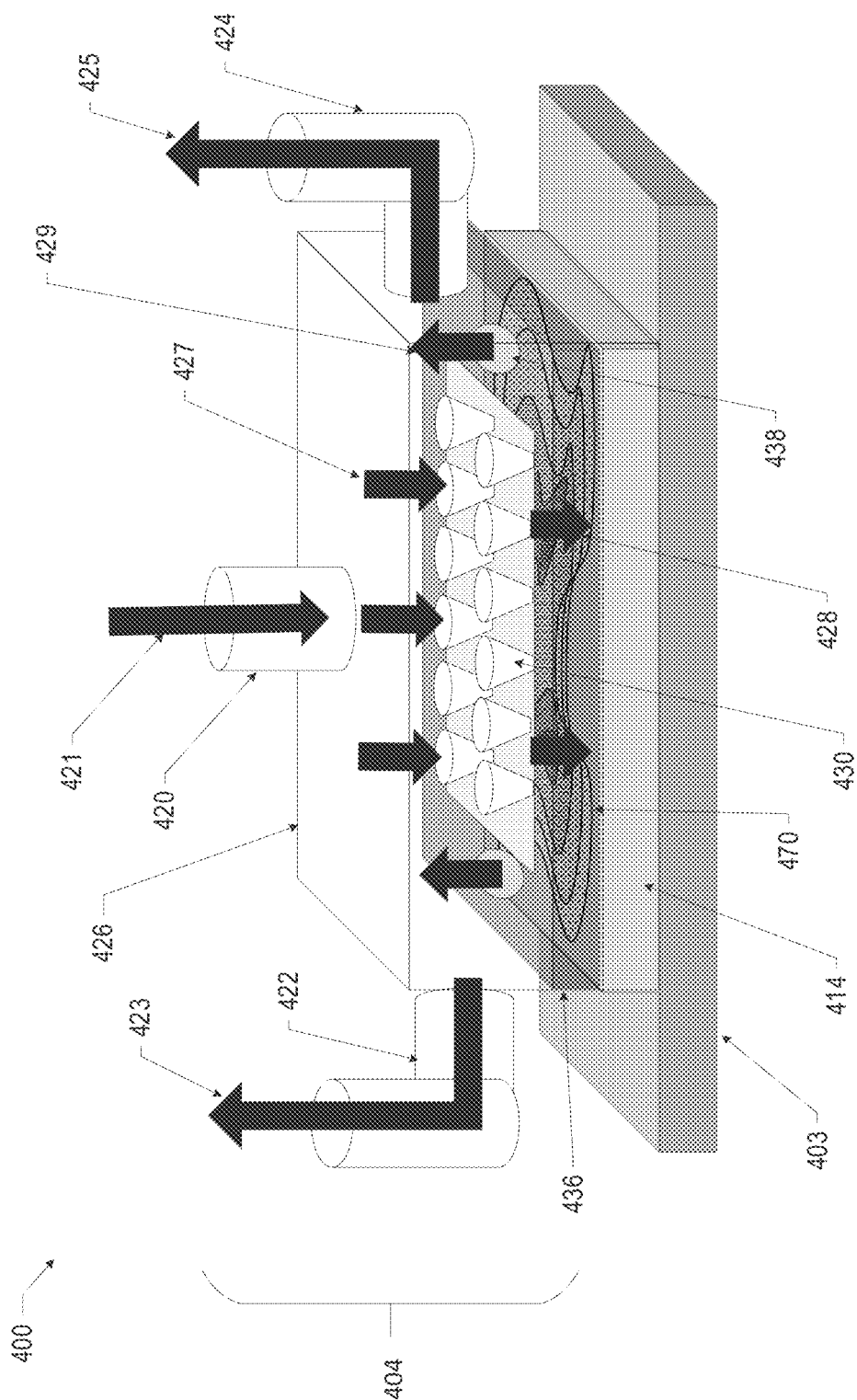
FIG. 4 is a perspective view of a microelectronic assembly including an exemplary fluid impingement cooling assembly, in accordance with various embodiments.

FIG. 4 is a perspective view of the microelectronic assembly of FIG. 3, in accordance with various embodiments. As shown in FIG. 4, a microelectronic assembly 400 may include a heat generating electronic component 414 having a surface 470, a package substrate 403, and a cooling assembly 404 having a plurality of rotatable nozzles 430. The electronic component 414 may have the cooling assembly 404 on the surface 470 and may be coupled to the package substrate 403 on an opposing surface. The cooling assembly 404 may include a housing 426 for containing fluid, and a nozzle plate 436 for housing a plurality of rotatable nozzles 430. The housing 426 may include a fluid inlet 420, a first fluid outlet 422, and a second fluid outlet 424. The housing 426 may provide a closed system to flow fluid through the fluid inlet 420 through the plurality of rotatable nozzles 430 to the surface 470 of the electronic component 414 and out the fluid outlets 422, 424. As shown in FIG. 4, the fluid outlets 422, 424 may be positioned above the nozzle plate 436. Fluid flow through the cooling apparatus is depicted by the arrows. Fluid enters 421 the cooling apparatus at the fluid inlet 420, flows downward 427 through the plurality of rotatable nozzles 430 to impinge 428 on the surface 470, then flows upwards 429 through the openings 438 in the nozzle plate 436 to exit 423, 425 out the fluid outlets 422, 424. The fluid may be any suitable liquid or gas, such as a coolant, for example, water, fluorochemical liquids, silicone oil, ethylene glycol water, poly-alpha-olefin, or silicate ester, or argon or nitrogen, that may be circulated, usually by a pump (not shown), to more efficiently dissipate heat from the surface 470. The fluid may also include additives to prevent corrosion of the different components or to allow operation at higher/lower temperatures (e.g. additives to water to decrease its freezing point or increase its boiling point). The coolant used may depend on the coolant's properties, including viscosity and heat capacity, circulation flow rate, and the temperature rise during device operation.

FIGS. 5A and 5B are schematic illustrations of exemplary structures for rotating a nozzle of a fluid impingement cooling assembly, in accordance with various embodiments. FIG. 5A shows a nozzle 530A supported by a gimbal 560, commonly referred to as a gimbal ring. FIG. 5A shows a set of three gimbals, commonly referred to as a three-axis gimbal, one mounted on the other with orthogonal pivot axes, to enable rotation or gimballing in any direction. In some embodiments, the innermost gimbal may be fixed to the nozzle. A nozzle may be gimballed or oriented to create angled jet vectoring impingement such that the fluid may be jet vectored onto a surface. Jet vectoring may include changing the orientation, direction, and/or angle of the fluid to intentionally impinge a target area.

FIG. 5B shows a nozzle 530B supported by a strut 562. Although FIG. 5B shows the strut 562 being connected at the center of the nozzle 530B, the 562 may be connected at any suitable location on the nozzle, including, for example, at the bottom or top of the nozzle. As shown in FIG. 5B, the strut 562 may include a ball joint 564 to enable rotation of the nozzle 530B in any direction. The structures of FIGS. 5A-5B are exemplary and any suitable structure to enable rotation of a nozzles may be used.

The rotatable nozzles may have any suitable shape, including conical, cylindrical, bell-shaped, convergent-divergent, and cuboidal, among others, and may have any suitable size, including micro or macro. The size and shape of the nozzles may depend on the size and shape of the nozzle plate and/or target surface to be cooled. For example, a nozzle plate may have dimensions ranging between 4 mm$^2$ and 400 mm², and an individual nozzle of the plurality of nozzles may have a height ranging between 0.5 mm and 10 mm. In some embodiments, an individual nozzle of the plurality of nozzles may have a height ranging between 1 mm and 5 mm. In some embodiments, a nozzle plate may have dimensions equal to a target surface. In some embodiments, a nozzle plate may have dimensions greater than a target surface, for example, when a cooling apparatus cools multiple target surfaces. In some embodiments, a nozzle plate may have dimensions smaller than a target surface. In some embodiments, the plurality of nozzles may have the same size and shape. In some embodiments, the plurality of nozzles may have different sizes. In some embodiments, the plurality of nozzles may have different shapes.

FIGS. 6A and 6B are schematic illustrations of exemplary conical nozzle designs, in accordance with various embodiments. FIGS. 6A and 6B show conical nozzles 630A, 630B having different aspect ratios. An aspect ratio of a nozzle may be defined as the height (H) divided by the lower diameter (DI) of the nozzle. For example, conical nozzle 630A may have a height (H) of 1 millimeter (mm), an upper diameter (Dh) of 0.50 mm, a lower diameter (DI-A) of 0.25 mm, and an aspect ratio of 4, and conical nozzle 630B may have a height (H) of 1 mm, an upper diameter (Dh) of 0.50 mm, a lower diameter (DI-B) of 0.125 mm, and an aspect ratio of 8. Conical nozzles having higher aspect ratios may accelerate the flow of the fluid. In some embodiments, conical nozzles having higher aspect ratios may perform better to cool a surface by yielding higher heat transfer coefficients and lower temperatures.

Figure 7:
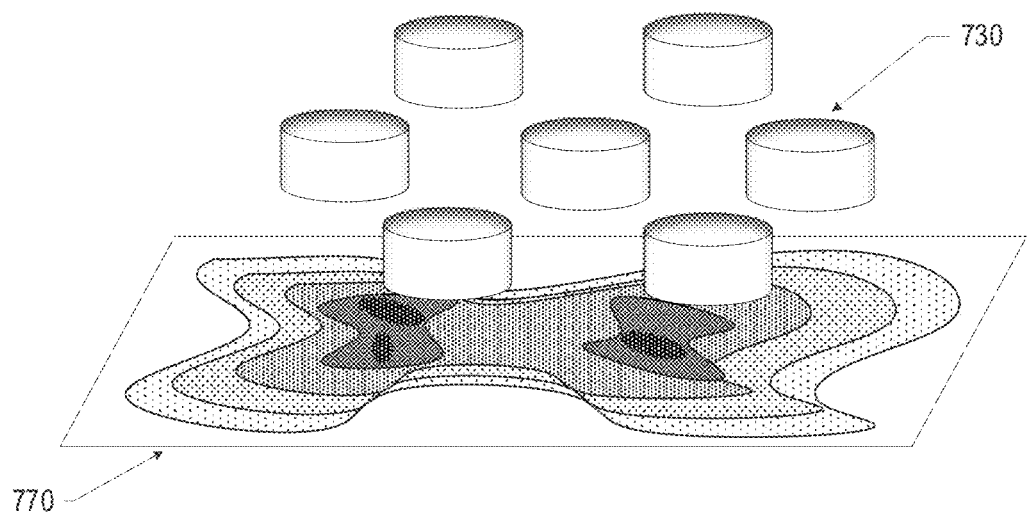
FIG. 7 is a perspective view of another exemplary nozzle design, in accordance with various embodiments.

FIG. 7 is a perspective view of another exemplary nozzle design, in accordance with various embodiments. As shown in FIG. 7, the plurality of nozzles may have a cylindrical shape and may have any suitable number, size, and arrangement to efficiently cool a surface 770. For example, cylindrical nozzles 730 may be gimballed to impinge fluid on surface 770 via jet vectoring.

Figure 8:
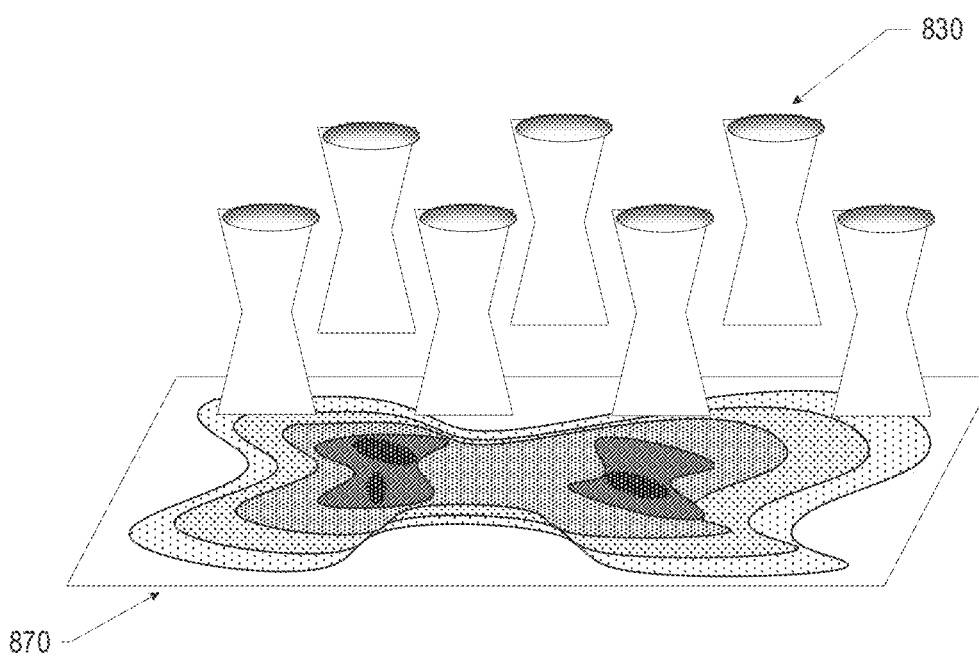
FIG. 8 is a perspective view of another exemplary nozzle design, in accordance with various embodiments.

FIG. 8 is a perspective view of another exemplary nozzle design, in accordance with various embodiments. As shown in FIG. 8, the plurality of nozzles may have a convergent-divergent shape and may have any suitable number, size, and arrangement to efficiently cool a surface 870. For example, convergent-divergent nozzles 830 may be gimballed to impinge fluid on surface 870 via jet vectoring.

Figure 9:
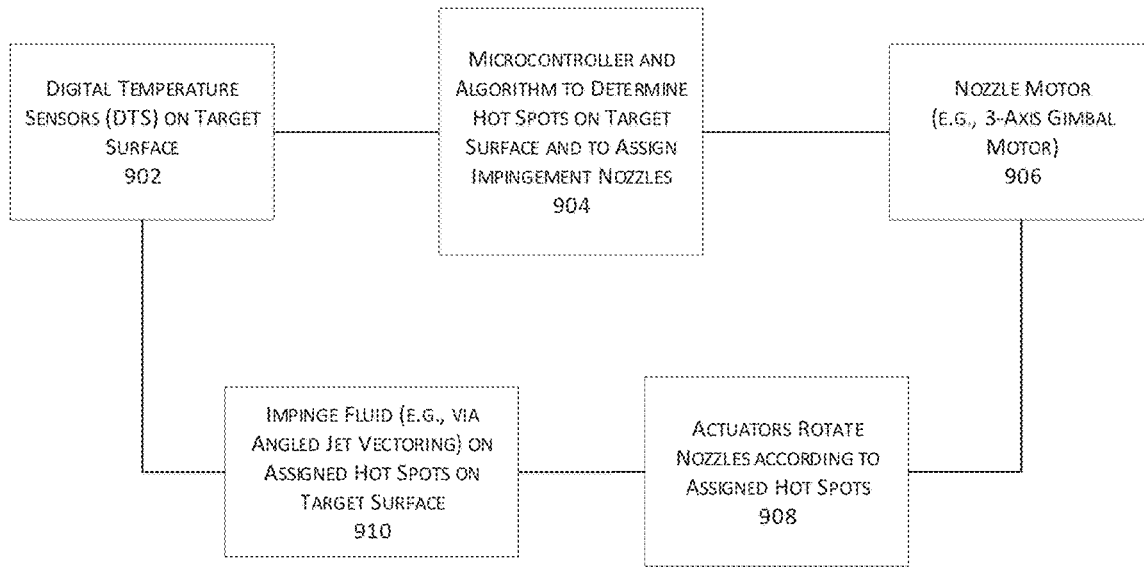
FIG. 9 is a block diagram of an exemplary fluid impingement cooling assembly, in accordance with various embodiments.

FIG. 9 is a block diagram of an exemplary fluid impingement cooling assembly, in accordance with various embodiments. As shown in FIG. 9, in some embodiments, a target surface may include a plurality of thermal sensors to continuously provide thermal data regarding the target surface. For example, the thermal data may be analyzed to continuously identify hotspots and/or provide temperature profiles on the target surface and assign nozzles for fluid impingement. At 902, thermal sensors, for example, Digital Temperature Sensors (DTS), may be included on a target surface to measure the temperature of the target surface. The thermal sensors may be arranged in a grid such that an individual thermal sensor may have an assigned area or footprint for measuring a surface temperature at a particular location (e.g., at X, Y direction). In some embodiments, the number of rotatable nozzles equals the number of thermal sensors. In some embodiments, the number of rotatable nozzles is greater than the number of thermal sensors. In some embodiments, the number of rotatable nozzles is less than the number of thermal sensors. At 904, a microcontroller receives the temperature data from the thermal sensors. In some embodiments, the microcontroller is housed with or embedded within the nozzle plate. In some embodiments, the microcontroller is located on a circuit board. The microcontroller and algorithm may analyze the thermal data and may map the temperatures on the target surface based on the thermal sensor locations. The microcontroller may determine a hotspot location based on the thermal data and a threshold temperature. The microcontroller may identify or assign one or more rotatable nozzles to impinge fluid on the hotspot. In some embodiments, the one or more assigned nozzles may be the nozzles located closest to the hotspot. In some embodiments, any unassigned nozzles (e.g., nozzles not assigned to rotate and impinge fluid on a hotspot) may be turned off so that mass fluid flow may be increased to the assigned nozzles. For example, a nozzle may be turned off by the microcontroller, for example, by placing a lid on any unassigned nozzle on the orifice plate. At 906, the microcontroller may signal a motor regarding the assigned nozzles. At 908, the motor may signal, for example, an actuator or a strut, to rotate the assigned nozzles to impinge fluid on the hotspot. In some embodiments, the actuator may gimbal the assigned nozzles to jet vector fluid on the hotspot. At 910, the assigned nozzles may impinge fluid on the hotspot on the target surface for a duration, until a specified temperature is reached, or for the operational duration so that the hotspot is continuously cooled while the electronic component is operational. In some embodiments, the target surface may be a bare die silicon. In some embodiments, the target surface may be high power density silicon. In some embodiments, the target surface may be a die, such as a processor, a microprocessor, such as an Application Specific Integrated Circuit (ASIC), or a Field Programmable Gate Array (FPGA). In some embodiments, the target surface may be a housing on a heat generating electronic component. In some embodiments, the target surface may be a heat spreader or cooling plate on the electronic component (e.g., a lidded IC package). In some embodiments, the target surface may be a multi-die package.

Figure 10:
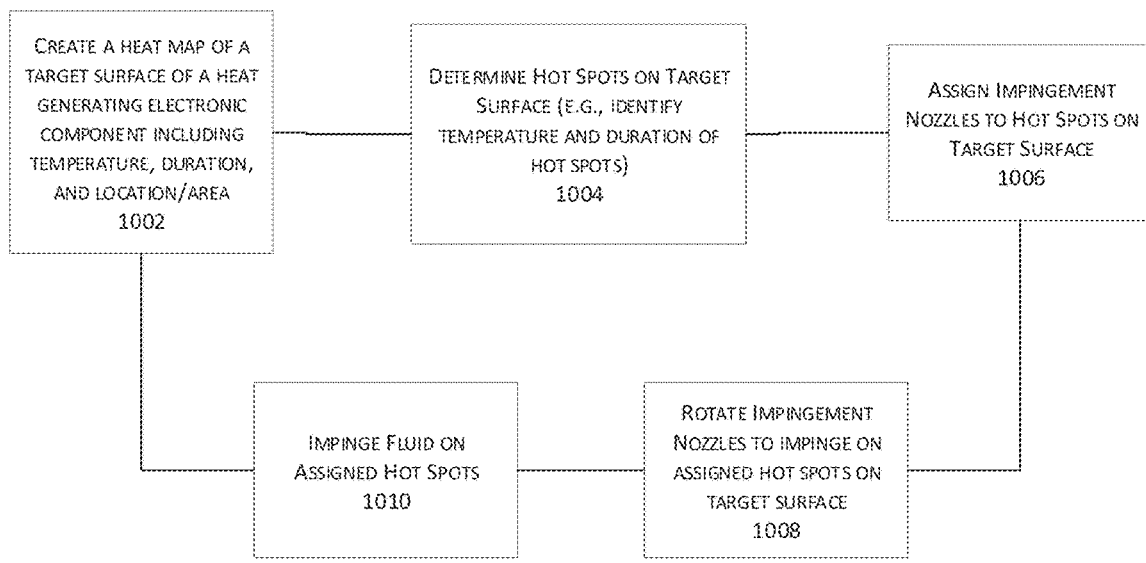
FIG. 10 is a block diagram of another exemplary fluid impingement cooling assembly, in accordance with various embodiments.

FIG. 10 is a block diagram of another exemplary fluid impingement cooling assembly, in accordance with various embodiments. As shown in FIG. 10, in some embodiments, a heat map, or power map, of a target surface may be create based on a pre-recording or modeling of temperatures of the target surface during operation of the electronic component. For example, temperature data of a surface of an electronic component during operation may be pre-recorded and transmitted to a microcontroller for determining the temperature and identifying hotspots of the target surface. The heat map may be used to configure the plurality of nozzles to impinge fluid for a duration on the target surface, including assigning and rotating one or more nozzles to one or more hotspots. At 1002, a heat map of a target surface of an electronic component during operation may be created. A heat map may include a grid identifying a temperature, a duration, and a location on the target surface. In some embodiments, an electronic component may operate or run different programs, and a heat map may be created for each different program. At 1004, a processor may analyze the heat map and may determine a hotspot based on the thermal data and a threshold temperature. At 1006, a processor may assign one or more rotatable nozzles to impinge fluid on the hotspot. In some embodiments, a hotspot location, a threshold temperature, and nozzle assignment may be determined based on the program being run by the electronic component. At 1008, a processor may signal to rotate the one or more assigned nozzles. At 1010, the one or more assigned nozzles may impinge fluid on the hotspot for a duration, or for the operational duration so that the hotspot is continuously cooled while the electronic component is operational. The target surface may be any target surface as described above with reference to FIG. 9.

Figure 11:
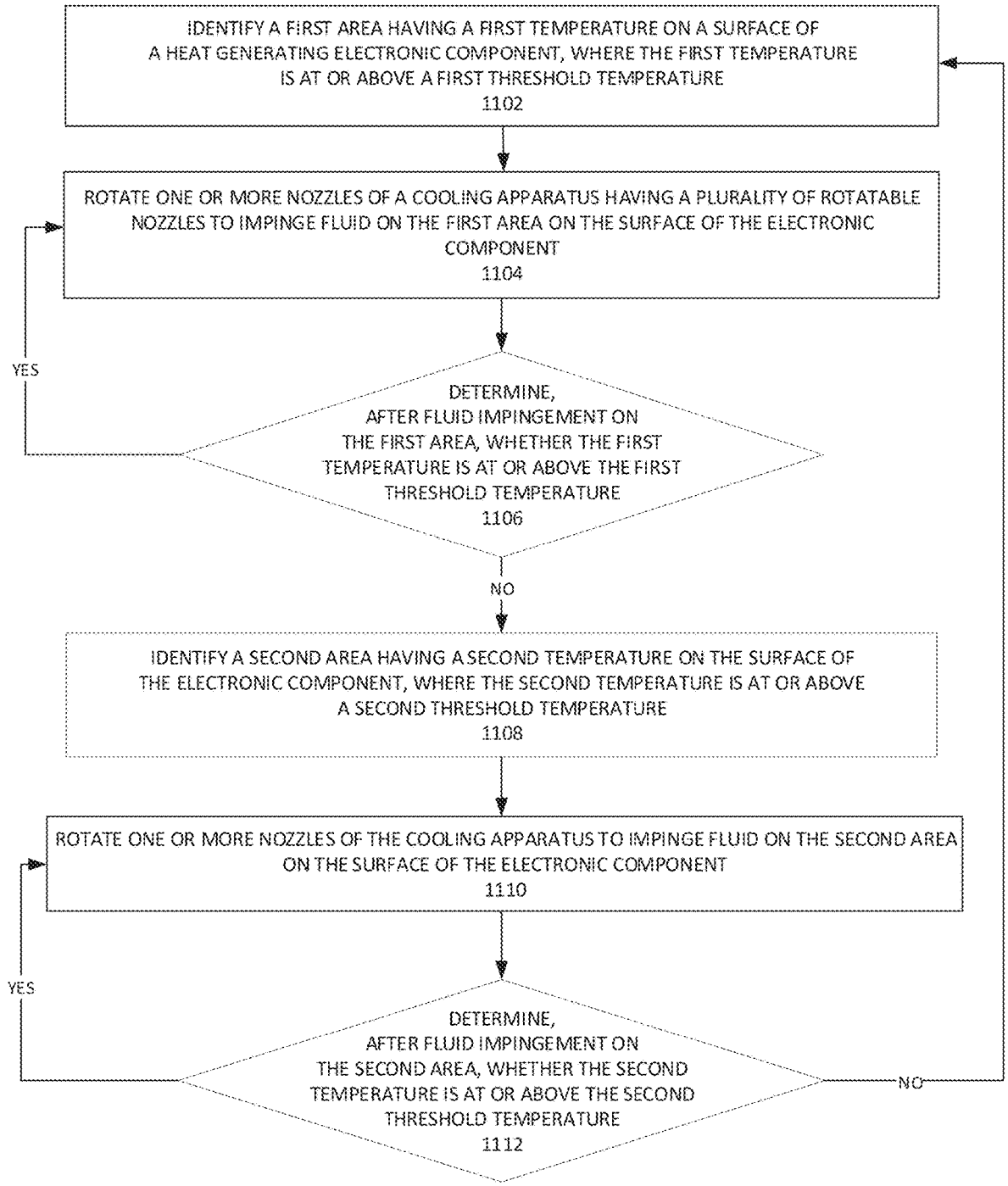
FIG. 11 is a flow diagram of an exemplary method of cooling a target surface using a fluid impingement cooling assembly in accordance with various embodiments.

FIG. 11 is a flow diagram of an exemplary method of cooling a target surface using a fluid impingement cooling assembly in accordance with various embodiments. At 1102, identify a first area having a first temperature on a surface of a heat generating electronic component, where the first temperature is at or above a threshold temperature. At 1104, rotate one or more nozzles of a cooling apparatus having a plurality of rotatable nozzles to impinge fluid on the first area on the surface of the electronic component. At 1106, determine, after impinging fluid on the first area, whether the first temperature is at or above the first threshold temperature, and if the first temperature is still at or above the first threshold temperature, continue impinging fluid on the first area. At 1108, if the first temperature is below the first threshold temperature after impinging fluid on the first area, identify a second area having a second temperature on the surface of the electronic component, where the second temperature is at or above a second threshold temperature. At 1110 rotate one or more nozzles of the cooling apparatus to impinge fluid on the second area on the surface of the electronic component. At 1112, determine, after impinging fluid on the second area, whether the second temperature is at or above the second threshold temperature, and if the second temperature is still at or above the second threshold temperature, continue impinging fluid on the second area. If the second temperature is below the second threshold temperature after impinging fluid on the second area, repeat the process starting at 1102. In some embodiments, the process may continue by identifying a third area having a third temperature above a third threshold temperature and may continue until all hotspots have been identified and cooled. In some embodiments, the first and second areas may be identified at the same time. In some embodiments, the first and second areas may be identified based on temperature data received from thermal sensors on the surface of the electronic component. In some embodiments, the first and second areas may be identified based on a heat map of the electronic component (e.g., pre-recorded temperature data of the electronic component during operation). In some embodiments, the microcontroller may analyze the received temperature data to identify in ascending or descending order the hottest area to the coolest area of the surface of the electronic component, then may assign one or more nozzles to the hottest area (e.g., the first hotspot), one or more nozzles to the second hottest area (e.g., the second hotspot), and so on until all areas have been assigned nozzles, or until previously assigned areas have been sufficiently cooled and nozzles may be reassigned. By sorting the temperature data from hottest to coolest, the surface of the electronic component may be cooled more efficiently as the hottest area may be cooled first.

Figure 12:
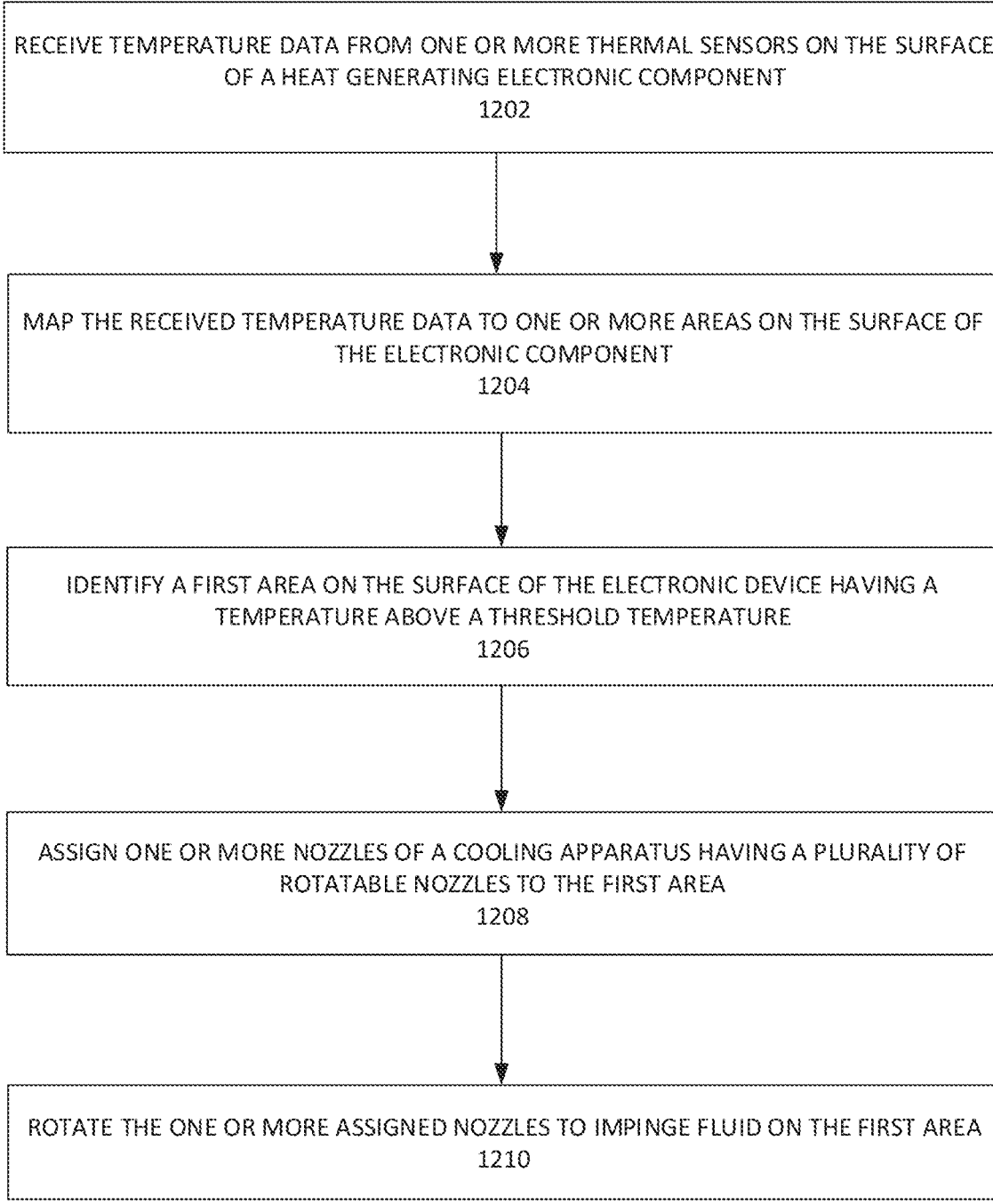
FIG. 12 is a flow diagram of another exemplary method of cooling a target surface using a fluid impingement cooling assembly in accordance with various embodiments.

FIG. 12 is a flow diagram of another exemplary method of cooling a target surface using a fluid impingement cooling assembly in accordance with various embodiments. At 1202, receive temperature data from one or more thermal sensors on the surface of a heat generating electronic component. At 1204, map the received temperature data to one or more areas on the surface of the electronic component. At 1206, identify a first area on the surface of the electronic component having a temperature above a threshold temperature. At 1208, assign one or more nozzles of a cooling apparatus having a plurality of rotatable nozzles to the first area. At 1210, rotate the one or more assigned nozzles to impinge fluid on the first area.

FIGS. 13A-B are top views of a wafer 1301 and dies 1305 that may be included in a microelectronic assembly disclosed herein. The wafer 1301 may be composed of semiconductor material and may include one or more dies 1305 having IC elements formed on a surface of the wafer 1301. Each of the dies 1305 may be a repeating unit of a semiconductor product that includes any suitable IC. After the fabrication of the semiconductor product is complete, the wafer 1301 may undergo a singulation process in which each of the dies 1305 is separated from one another to provide discrete "chips" of the semiconductor product. The die 1305 may include one or more transistors (e.g., some of the transistors 1340 of FIG. 13C, discussed below) and/or supporting circuitry to route electrical signals to the transistors, as well as any other IC components. In some embodiments, the wafer 1301 or the die 1305 may include a memory device (e.g., a static random access memory (SRAM) device), a logic device (e.g., AND, OR, NAND, or NOR gate), or any other suitable circuit element. Multiple ones of these devices may be combined on a single die 1305. For example, a memory array formed by multiple memory devices may be formed on a same die 1305 as a processing device (e.g., the processing device 1502 of FIG. 15) or other logic that is configured to store information in the memory devices or execute instructions stored in the memory array. In some embodiments, the die 1305 may include circuitry that is to couple to and interact with circuitry provided by integral devices in the package substrate, after the die 1305 is coupled to the package substrate, as discussed above.

FIG. 13C is a cross-sectional side view of an IC device 1300 that may be included in a die that may be coupled to any of the microelectronic assemblies disclosed herein. In particular, one or more of the IC devices 1300 may be included in one or more dies. The IC device 1300 may be formed on a substrate 1302 (e.g., the wafer 1301 of FIG. 13A) and may be included in a die (e.g., the die 1305 of FIG. 13B). The substrate 1302 may be a semiconductor substrate composed of semiconductor material systems including, for example, N-type or P-type materials systems. The substrate 1302 may include, for example, a crystalline substrate formed using a bulk silicon or a silicon-on-insulator substructure. In some embodiments, the substrate 1302 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1302. Although a few examples of materials from which the substrate 1302 may be formed are described here, any material that may serve as a foundation for an IC device 1300 may be used. The substrate 1302 may be part of a singulated die (e.g., the dies 1305 of FIG. 13B) or a wafer (e.g., the wafer 1301 of FIG. 13A).

The IC device 1300 may include one or more device layers 1304 disposed on the substrate 1302. The device layer 1304 may include features of one or more transistors 1340 (e.g., metal oxide semiconductor field-effect transistors (MOSFETs)) formed on the substrate 1302. The device layer 1304 may include, for example, one or more source and/or drain (S/D) regions 1320, a gate 1322 to control current flow in the transistors 1340 between the S/D regions 1320, and one or more S/D contacts 1324 to route electrical signals to/from the S/D regions 1320. The transistors 1340 may include additional features not depicted for the sake of clarity, such as device isolation regions, gate contacts, and the like. The transistors 1340 are not limited to the type and configuration depicted in FIG. 13C and may include a wide variety of other types and configurations such as, for example, planar transistors, nonplanar transistors, or a combination of both. Nonplanar transistors may include FinFET transistors, such as double-gate transistors or tri-gate transistors, and wraparound or all-around gate transistors, such as nanoribbon and nanowire transistors.

Each transistor 1340 may include a gate 1322 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work-function metal or N-type work-function metal, depending on whether the transistor 1340 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 1340 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1320 may be formed within the substrate 1302 adjacent to the gate 1322 of each transistor 1340. The S/D regions 1320 may be formed using either an implantation/diffusion process or an etching/deposition process, for example. In the former process, dopants such as boron, aluminum, antimony, phosphorous, or arsenic may be ion-implanted into the substrate 1302 to form the S/D regions 1320. An annealing process that activates the dopants and causes them to diffuse farther into the substrate 1302 may follow the ion-implantation process. In the latter process, the substrate 1302 may first be etched to form recesses at the locations of the S/D regions 1320. An epitaxial deposition process may then be carried out to fill the recesses with material that is used to fabricate the S/D regions 1320. In some implementations, the S/D regions 1320 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1320 may be formed using one or more alternate semiconductor materials such as germanium or a group III-V material or alloy. In further embodiments, one or more layers of metal and/or metal alloys may be used to form the S/D regions 1320.

Electrical signals, such as power and/or input/output (I/O) signals, may be routed to and/or from the transistors 1340 of the device layer 1304 through one or more interconnect layers disposed on the device layer 1304 (illustrated in FIG. 13C as interconnect layers 1306-1310). For example, electrically conductive features of the device layer 1304 (e.g., the gate 1322 and the S/D contacts 1324) may be electrically coupled with the interconnect structures 1328 of the interconnect layers 1306-1310. The one or more interconnect layers 1306-1310 may form an interlayer dielectric (ILD) stack 1319 of the IC device 1300.

The interconnect structures 1328 may be arranged within the interconnect layers 1306-1310 to route electrical signals according to a wide variety of designs (in particular, the arrangement is not limited to the particular configuration of interconnect structures 1328 depicted in FIG. 13C). Although a particular number of interconnect layers 1306-1310 is depicted in FIG. 13C, embodiments of the present disclosure include IC devices having more or fewer interconnect layers than depicted.

In some embodiments, the interconnect structures 1328 may include trench structures 1328*a* (sometimes referred to as "lines") and/or via structures 1328*b* (sometimes referred to as "holes") filled with an electrically conductive material such as a metal. The trench structures 1328*a* may be arranged to route electrical signals in a direction of a plane that is substantially parallel with a surface of the substrate 1302 upon which the device layer 1304 is formed. For example, the trench structures 1328*a* may route electrical signals in a direction in and out of the page from the perspective of FIG. 13C. The via structures 1328*b* may be arranged to route electrical signals in a direction of a plane that is substantially perpendicular to the surface of the substrate 1302 upon which the device layer 1304 is formed. In some embodiments, the via structures 1328*b* may electrically couple trench structures 1328*a* of different interconnect layers 1306-1310 together.

The interconnect layers 1306-1310 may include a dielectric material 1326 disposed between the interconnect structures 1328, as shown in FIG. 13C. In some embodiments, the dielectric material 1326 disposed between the interconnect structures 1328 in different ones of the interconnect layers 1306-1310 may have different compositions; in other embodiments, the composition of the dielectric material 1326 between different interconnect layers 1306-1310 may be the same.

A first interconnect layer 1306 (referred to as Metal 1 or "M1") may be formed directly on the device layer 1304. In some embodiments, the first interconnect layer 1306 may include trench structures 1328a and/or via structures 1328b, as shown. The trench structures 1328a of the first interconnect layer 1306 may be coupled with contacts (e.g., the S/D contacts 1324) of the device layer 1304.

A second interconnect layer 1308 (referred to as Metal 2 or "M2") may be formed directly on the first interconnect layer 1306. In some embodiments, the second interconnect layer 1308 may include via structures 1328b to couple the trench structures 1328a of the second interconnect layer 1308 with the trench structures 1328a of the first interconnect layer 1306. Although the trench structures 1328a and the via structures 1328b are structurally delineated with a line within each interconnect layer (e.g., within the second interconnect layer 1308) for the sake of clarity, the trench structures 1328a and the via structures 1328b may be structurally and/or materially contiguous (e.g., simultaneously filled during a dual-damascene process) in some embodiments.

A third interconnect layer 1310 (referred to as Metal 3 or "M3") (and additional interconnect layers, as desired) may be formed in succession on the second interconnect layer 1308 according to similar techniques and configurations described in connection with the second interconnect layer 1308 or the first interconnect layer 1306.

The IC device 1300 may include a solder resist material 1334 (e.g., polyimide or similar material) and one or more bond pads 1336 formed on the interconnect layers 1306-1310. The bond pads 1336 may provide the contacts to couple to first level interconnects, for example. The bond pads 1336 may be electrically coupled with the interconnect structures 1328 and configured to route the electrical signals of the transistor(s) 1340 to other external devices. For example, solder bonds may be formed on the one or more bond pads 1336 to mechanically and/or electrically couple a chip including the IC device 1300 with another component (e.g., a circuit board). The IC device 1300 may have other alternative configurations to route the electrical signals from the interconnect layers 1306-1310 than depicted in other embodiments. For example, the bond pads 1336 may be replaced by or may further include other analogous features (e.g., posts) that route the electrical signals to external components.

Figure 14:
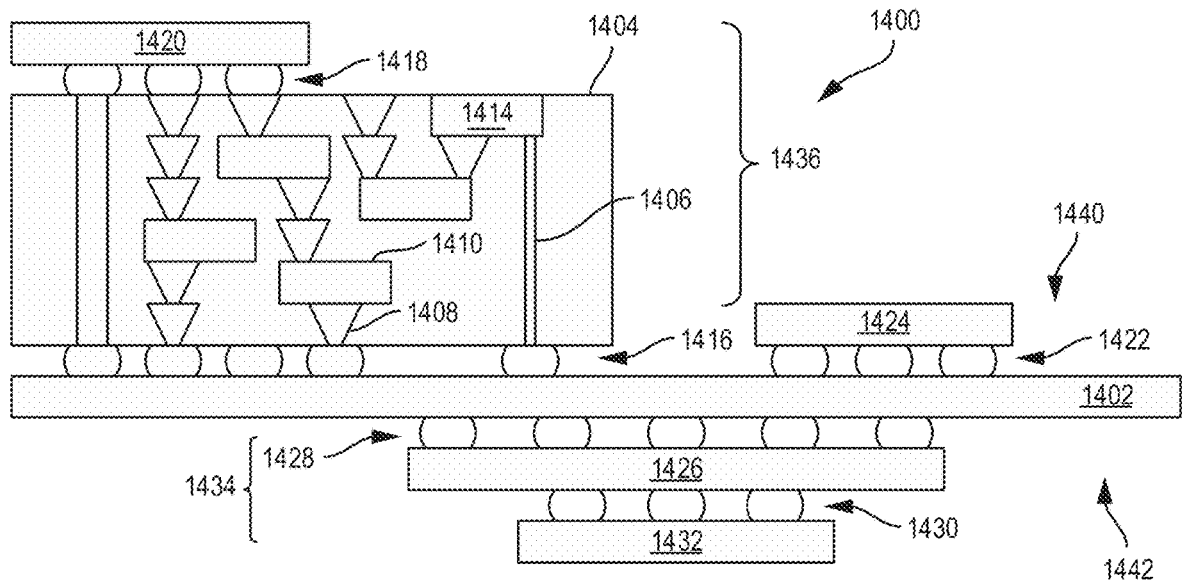
FIG. 14 is a cross-sectional side view of an IC device assembly that may include any of the embodiments of the IC packages disclosed herein.

FIG. 14 is a cross-sectional side view of an IC device assembly 1400 that may include any of the embodiments of the microelectronic assemblies disclosed herein. The IC device assembly 1400 includes a number of components disposed on a circuit board 1402. The IC device assembly 1400 may include components disposed on a first face 1440 of the circuit board 1402 and an opposing second face 1442 of the circuit board 1402; generally, components may be disposed on one or both faces 1440 and 1442.

In some embodiments, the circuit board 1402 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1402. In other embodiments, the circuit board 1402 may be a non-PCB substrate.

The IC device assembly 1400 illustrated in FIG. 14 includes a package-on-interposer structure 1436 coupled to the first face 1440 of the circuit board 1402 by coupling components 1416. The coupling components 1416 may electrically and mechanically couple the package-on-interposer structure 1436 to the circuit board 1402, and may include solder balls (as shown in FIG. 14), male and female portions of a socket, an adhesive, an underfill material, and/or any other suitable electrical and/or mechanical coupling structure.

The package-on-interposer structure 1436 may include an IC package 1420 coupled to an interposer 1404 by coupling components 1418. The coupling components 1418 may take any suitable form for the application, such as the forms discussed above with reference to the coupling components 1416. For example, the coupling components 1418 may be second level interconnects. Although a single IC package 1420 is shown in FIG. 14, multiple IC packages may be coupled to the interposer 1404; indeed, additional interposers may be coupled to the interposer 1404. The interposer 1404 may provide an intervening substrate used to bridge the circuit board 1402 and the IC package 1420. The IC package 1420 may be or include, for example, a die (the die 1305 of FIG. 13B), an IC device (e.g., the IC device 1300 of FIG. 13C), or any other suitable component. In particular, the IC package 1420 may take any of the embodiments of the IC package substrates disclosed herein. Generally, the interposer 1404 may spread a connection to a wider pitch or reroute a connection to a different connection. For example, the interposer 1404 may couple the IC package 1420 (e.g., a die) to a ball grid array (BGA) of the coupling components 1416 for coupling to the circuit board 1402. In the embodiment illustrated in FIG. 14, the IC package 1420 and the circuit board 1402 are attached to opposing sides of the interposer 1404; in other embodiments, the IC package 1420 and the circuit board 1402 may be attached to a same side of the interposer 1404. In some embodiments, three or more components may be interconnected by way of the interposer 1404.

The interposer 1404 may be formed of an epoxy resin, a fiberglass-reinforced epoxy resin, a ceramic material, or a polymer material such as polyimide. In some embodiments, the interposer 1404 may be formed of alternate rigid or flexible materials that may include the same materials used in a semiconductor substrate, such as silicon, germanium, and other group III-V and group IV materials. The interposer 1404 may include metal interconnects 1408 and vias 1410, including but not limited to through-silicon vias (TSVs) 1406. The interposer 1404 may further include embedded devices 1414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1404. The package-on-interposer structure 1436 may take the form of any of the package-on-interposer structures known in the art.

The IC device assembly 1400 may include an IC package 1424 coupled to the first face 1440 of the circuit board 1402 by coupling components 1422. The coupling components 1422 may take the form of any of the embodiments discussed above with reference to the coupling components 1416, and the IC package 1424 may take the form of any of the embodiments discussed above with reference to the IC package 1420. In particular, the IC package 1424 may take the form of any of the embodiments of the IC package disclosed herein.

The IC device assembly 1400 illustrated in FIG. 14 includes a PoP structure 1434 coupled to the second face 1442 of the circuit board 1402 by coupling components 1428. The PoP structure 1434 may include an IC package 1426 and an IC package 1432 coupled together by coupling components 1430 such that the IC package 1426 is disposed between the circuit board 1402 and the IC package 1432. The coupling components 1428 and 1430 may take the form of any of the embodiments of the coupling components 1416 discussed above, and the IC packages 1426 and 1432 may take the form of any of the embodiments of the IC package 1420 discussed above. In particular, the IC packages 1426 and 1432 may take any of the embodiments of the IC package substrates disclosed herein.

Figure 15:
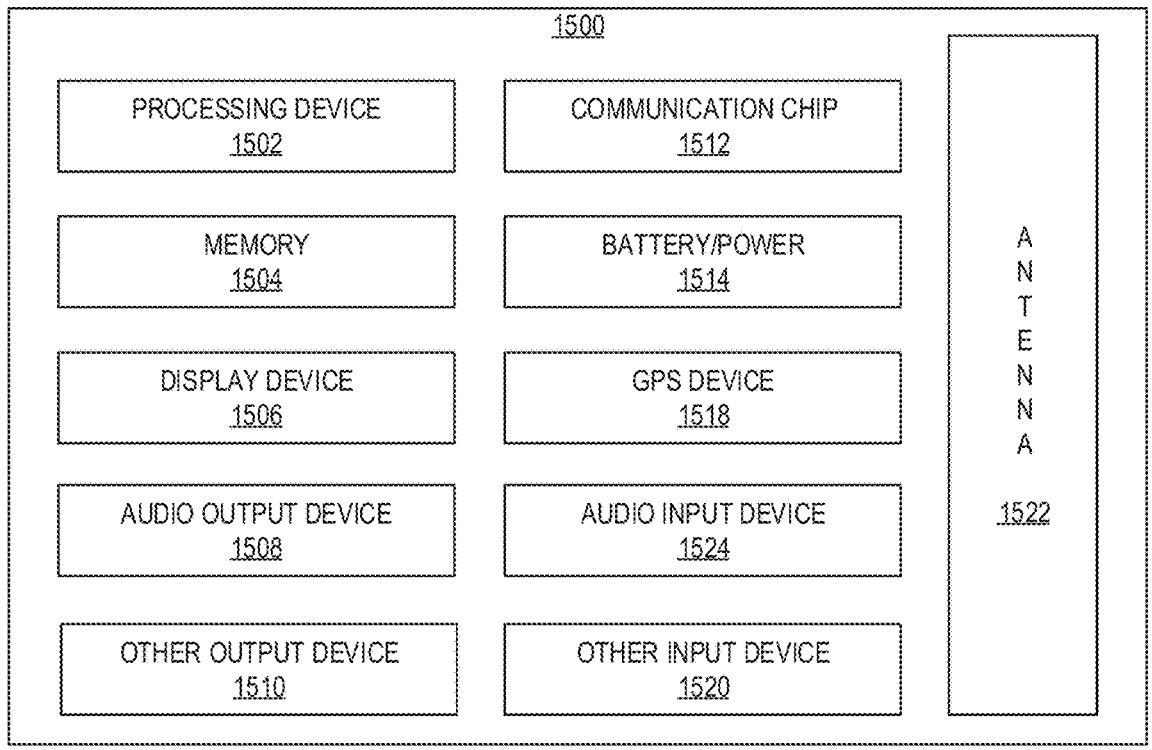
FIG. 15 is a block diagram of an example computing device that may include any of the embodiments of the IC packages disclosed herein.

FIG. 15 is a block diagram of an example computing device 1500 that may include one or more of the IC packages and IC structures disclosed herein. A number of components are illustrated in FIG. 15 as included in the computing device 1500, but any one or more of these components may be omitted or duplicated, as suitable for the application. In some embodiments, some or all of the components included in the computing device 1500 may be attached to one or more motherboards. In some embodiments, some or all of these components are fabricated onto a single system-on-a-chip (SoC) die.

Additionally, in various embodiments, the computing device 1500 may not include one or more of the components illustrated in FIG. 15, but the computing device 1500 may include interface circuitry for coupling to the one or more components. For example, the computing device 1500 may not include a display device 1506, but may include display device interface circuitry (e.g., a connector and driver circuitry) to which a display device 1506 may be coupled. In another set of examples, the computing device 1500 may not include an audio input device 1524 or an audio output device 1508, but may include audio input or output device interface circuitry (e.g., connectors and supporting circuitry) to which an audio input device 1524 or audio output device 1508 may be coupled.

The computing device 1500 may include a processing device 1502 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1502 may include one or more digital signal processors (DSPs), ASICs, CPUs, GPUs, cryptoprocessors (specialized processors that execute cryptographic algorithms within hardware), server processors, or any other suitable processing devices. The computing device 1500 may include a memory 1504, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1504 may include memory that shares a die with the processing device 1502. This memory may be used as cache memory and may include embedded dynamic random access memory (eDRAM) or spin transfer torque magnetic random access memory (STT-M RAM).

In some embodiments, the computing device 1500 may include a communication chip 1512 (e.g., one or more communication chips). For example, the communication chip 1512 may be configured for managing wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1512 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1512 may operate in accordance with other wireless protocols in other embodiments. The computing device 1500 may include an antenna 1522 to facilitate wireless communications and/or to receive other wireless communications (such as AM or FM radio transmissions).

In some embodiments, the communication chip 1512 may manage wired communications, such as electrical, optical, or any other suitable communication protocols (e.g., the Ethernet). As noted above, the communication chip 1512 may include multiple communication chips. For instance, a first communication chip 1512 may be dedicated to shorter-range wireless communications such as Wi-Fi or Bluetooth, and a second communication chip 1512 may be dedicated to longer-range wireless communications such as global positioning system (GPS), EDGE, GPRS, CDMA, WiMAX, LTE, EV-DO, or others. In some embodiments, a first communication chip 1512 may be dedicated to wireless communications, and a second communication chip 1512 may be dedicated to wired communications.

The computing device 1500 may include battery/power circuitry 1514. The battery/power circuitry 1514 may include one or more energy storage devices (e.g., batteries or capacitors) and/or circuitry for coupling components of the computing device 1500 to an energy source separate from the computing device 1500 (e.g., AC line power).

The computing device 1500 may include a display device 1506 (or corresponding interface circuitry, as discussed above). The display device 1506 may include any visual indicators, such as a heads-up display, a computer monitor, a projector, a touchscreen display, a liquid crystal display (LCD), a light-emitting diode display, or a flat panel display, for example.

The computing device 1500 may include an audio output device 1508 (or corresponding interface circuitry, as discussed above). The audio output device 1508 may include any device that generates an audible indicator, such as speakers, headsets, or earbuds, for example.

The computing device 1500 may include an audio input device 1524 (or corresponding interface circuitry, as discussed above). The audio input device 1524 may include any device that generates a signal representative of a sound, such as microphones, microphone arrays, or digital instruments (e.g., instruments having a musical instrument digital interface (MIDI) output).

The computing device 1500 may include a GPS device 1518 (or corresponding interface circuitry, as discussed above). The GPS device 1518 may be in communication with a satellite-based system and may receive a location of the computing device 1500, as known in the art.

The computing device 1500 may include an other output device 1510 (or corresponding interface circuitry, as discussed above). Examples of the other output device 1510 may include an audio codec, a video codec, a printer, a wired or wireless transmitter for providing information to other devices, or an additional storage device.

The computing device 1500 may include an other input device 1520 (or corresponding interface circuitry, as discussed above). Examples of the other input device 1520 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1500 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1500 may be any other electronic device that processes data.

The following paragraphs provide various examples of the embodiments disclosed herein.

Example 1 is an integrated circuit (IC) device assembly, including: a plurality of rotatable nozzles disposed in a nozzle plate, wherein the plurality of rotatable nozzles are rotatable individually; a microcontroller to identify a hotspot on a target surface of an IC device, wherein the hotspot has a temperature that is greater than a threshold temperature; and a motor coupled to the plurality of rotatable nozzles, wherein the motor causes one or more of the rotatable nozzles to rotate to impinge fluid on the hotspot.

Example 2 may include the subject matter of Example 1, and may further specify that the microcontroller identifies the hotspot based on temperature data received from a plurality of thermal sensors on the target surface of the IC device.

Example 3 may include the subject matter of Example 1, and may further specify that the microcontroller identifies the hotspot based on pre-recorded temperature data of the target surface of the IC device during operation.

Example 4 may include the subject matter of Example 1, and may further specify that the threshold temperature is 40 degrees Celsius.

Example 5 may include the subject matter of Example 1, and may further specify that the threshold temperature is 60 degrees Celsius.

Example 6 may include the subject matter of Example 1, and may further specify that one or more of the rotatable nozzles are rotated by a gimbal.

Example 7 may include the subject matter of Example 6, and may further specify that the gimbal is a three-axis gimbal.

Example 8 may include the subject matter of Example 1, and may further specify that the microcontroller is disposed on the nozzle plate.

Example 9 may include the subject matter of Example 1, and may further specify that one or more of the rotatable nozzles have a height between 1 mm and 5 mm.

Example 10 may include the subject matter of Example 1, and may further specify that one or more of the rotatable nozzles have a conical shape.

Example 11 may include the subject matter of Example 10, and may further specify that the one or more of the rotatable nozzles having a conical shape have an aspect ratio between 4 and 8.

Example 12 may include the subject matter of Example 1, and may further specify that one or more of the rotatable nozzles have a cylindrical shape or a convergent-divergent shape.

Example 13 may include the subject matter of Example 11, and may further specify that the IC device is a bare die.

Example 14 may include the subject matter of Example 13, and may further specify that the bare die is a high power density silicon.

Example 15 may include the subject matter of Example 13, and may further specify that the bare die is one of: a processor, a microprocessor, or a Field Programmable Gate Array (FPGA).

Example 16 is a computing device, including: an integrated circuit (IC) package, including: a package substrate having a first face and an opposing second face; an electronic component having a first face and an opposing second face, wherein the first face of the electronic component is electrically coupled to the first face of the package substrate, and wherein the second face of the electronic component has a first target area and a second target area different from the first target area; and a cooling apparatus proximate to the second face of the electronic component, including: a fluid inlet; a fluid outlet; and a plurality of rotatable nozzles disposed in a nozzle plate to impinge fluid on the second face of the electronic component, wherein an individual rotatable nozzle of the plurality of rotatable nozzles in a first orientation impinges fluid on the first target area and when rotated to a second orientation impinges fluid on the second target area.

Example 17 may include the subject matter of Example 16, and may further specify that the first target area has a first temperature and the second target area has a second temperature above a threshold temperature, and may further include: a microcontroller to identify the first temperature and the second temperature; and a motor coupled to the plurality of rotatable nozzles, wherein the motor causes one or more rotatable nozzles to rotate from the first orientation to the second orientation to impinge fluid on the second target area.

Example 18 may include the subject matter of Example 17, and may further specify that the threshold temperature is 60 degrees Celsius.

Example 19 may include the subject matter of Example 17, and may further specify that the threshold temperature is 80 degrees Celsius.

Example 20 may include the subject matter of Example 16, and may further specify that an individual nozzle of the plurality of rotatable nozzles is rotated by a gimbal.

Example 21 may include the subject matter of Example 20, and may further specify that the gimbal is a three-axis gimbal.

Example 22 may include the subject matter of Example 16, and may further specify that the electronic component is a bare die.

Example 23 may include the subject matter of Example 22, and may further specify that the bare die is a high power density silicon.

Example 24 may include the subject matter of Example 23, and may further specify that the bare die is one of: a processor, a microprocessor, or a Field Programmable Gate Array (FPGA).

Example 25 may include the subject matter of Example 17, and may further include: a plurality of thermal sensors adjacent the second face of the electronic component to transmit temperature data of the second face to the microcontroller; and wherein the microcontroller identifies the first temperature and the second temperature based on the temperature data received from the plurality of thermal sensors.

Example 26 may include the subject matter of Example 17, and may further specify that the microcontroller is disposed on the nozzle plate.

Example 27 may include the subject matter of Example 17, and may further include: a circuit board, wherein the second face of the package substrate is electrically coupled to a face of the circuit board Example 28 may include the subject matter of Example 27, and may further specify that the microcontroller is on the circuit board.

Example 29 is a method of cooling an integrated circuit (IC) device, including: identifying, by control circuitry, a temperature of an area on a surface of an IC device, wherein the IC device includes an IC die; determining, by the control circuitry, that the temperature is at or above a threshold temperature; and causing, by the control circuitry, one or more nozzles of a cooling apparatus to rotate to impinge fluid on the area.

Example 30 may include the subject matter of Example 29, and may further specify that the area is a first area, the temperature is a first temperature, and the threshold temperature is a first threshold temperature, the method and may further include: determining, by the control circuitry, after impinging fluid on the first area, whether the first temperature is at or above the first threshold temperature; identifying, by the control circuitry, based on a determination after fluid impingement on the first area that the first temperature is below the first threshold temperature, a second temperature of a second area on the surface of the IC device; determining, by the control circuitry, that the second temperature is at or above a second threshold temperature; and causing, by the control circuitry, one or more nozzles of the cooling apparatus to rotate to impinge fluid on the second area.

Example 31 may include the subject matter of Example 29, and may further specify that one or more nozzles of the cooling apparatus is rotated by a gimbal.

Example 32 may include the subject matter of Example 31, and may further specify that the gimbal is a three-axis gimbal.

Example 33 may include the subject matter of Example 29, and may further specify that one or more nozzles of the cooling apparatus is rotated by a strut.

Example 34 may include the subject matter of Example 29, and may further specify that the temperature of the area is identified based on temperature data received from thermal sensors adjacent the surface of the IC device.

Example 35 may include the subject matter of Example 29, and may further specify that the temperature of the area is identified based on pre-recorded temperature data of the IC device during operation.

Example 36 may include the subject matter of Example 29, and may further specify that the IC die is a bare die.

Example 37 may include the subject matter of Example 36, and may further specify that the bare die is one of: a processor, a microprocessor, or a Field Programmable Gate Array (FPGA).

Example 38 may include the subject matter of Example 29, and may further specify that the threshold temperature is 80 degrees Celsius.

Example 39 may include the subject matter of Example 30, and may further specify that the second threshold temperature is 60 degrees Celsius.

The invention claimed is:

1. A computing device, comprising:
   an integrated circuit (IC) package, comprising:
      a package substrate having a first face and an opposing second face;
      an electronic component having a first face and an opposing second face, wherein the first face of the electronic component is electrically coupled to the first face of the package substrate, and wherein the second face of the electronic component has a first target area having a first temperature and a second target area different from the first target area, the second target area having a second temperature above a threshold temperature;
      a microcontroller to identify the first temperature and the second temperature;
      a cooling apparatus proximate to the second face of the electronic component, comprising:
         a fluid inlet;
         a fluid outlet; and
         a plurality of rotatable nozzles disposed in a nozzle plate to impinge fluid on the second face of the electronic component, wherein an individual rotatable nozzle of the plurality of rotatable nozzles in a first orientation impinges fluid on the first target area and when rotated to a second orientation impinges fluid on the second target area; and
         a motor coupled to the plurality of rotatable nozzles, wherein the motor causes one or more rotatable nozzles to rotate from the first orientation to the second orientation to impinge fluid on the second target area.

2. The computing device of claim 1, wherein the threshold temperature is 60 degrees Celsius.

3. The computing device of claim 1, wherein the threshold temperature is 80 degrees Celsius.

4. The computing device of claim 1, wherein an individual nozzle of the plurality of rotatable nozzles is rotated by a gimbal.

5. The computing device of claim 4, wherein the gimbal is a three-axis gimbal.

\* \* \* \* \*